United States Patent
Watanabe

(10) Patent No.: US 9,992,313 B2
(45) Date of Patent: Jun. 5, 2018

(54) ELECTRONIC DEVICE

(71) Applicant: KYOCERA Corporation, Kyoto (JP)

(72) Inventor: Takaaki Watanabe, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 0 days. days.

(21) Appl. No.: 15/032,875

(22) PCT Filed: Oct. 30, 2014

(86) PCT No.: PCT/JP2014/005520
§ 371 (c)(1),
(2) Date: Apr. 28, 2016

(87) PCT Pub. No.: WO2015/064112
PCT Pub. Date: May 7, 2015

(65) Prior Publication Data
US 2016/0241689 A1 Aug. 18, 2016

(30) Foreign Application Priority Data

Oct. 30, 2013 (JP) ................................ 2013-225806
Feb. 26, 2014 (JP) ................................ 2014-035635

(51) Int. Cl.
*H04R 25/00* (2006.01)
*H04M 1/03* (2006.01)
(Continued)

(52) U.S. Cl.
CPC ............. *H04M 1/03* (2013.01); *B06B 1/0644* (2013.01); *H01L 41/09* (2013.01); *H01L 41/098* (2013.01);
(Continued)

(58) Field of Classification Search
CPC ...... H04R 7/04; H04R 7/045; H04R 2499/11; H04R 2217/01; H04R 2400/03; H04R 2440/05
See application file for complete search history.

(56) References Cited

U.S. PATENT DOCUMENTS 7,639,826 B1* 12/2009 Azima .................. H04R 7/045
381/152
8,170,243 B2* 5/2012 Kondo .................. H04R 7/045
381/152
(Continued)

FOREIGN PATENT DOCUMENTS

JP 2003-244792 A 8/2003
JP 2004-187031 A 7/2004
(Continued)

OTHER PUBLICATIONS

An Office Action; "Notice of Reasons for Rejection," mailed by the Japanese Patent Office dated Jan. 9, 2018, which corresponds to Japanese Patent Application No. 2015-544816 and is related to U.S. Appl. No. 15/032,875; with English language Concise Explanation.
(Continued)

*Primary Examiner* — Matthew Eason
*Assistant Examiner* — Ryan Robinson
(74) *Attorney, Agent, or Firm* — Studebaker & Brackett PC

(57) ABSTRACT

An electronic device 1 includes: a panel 10; a housing 60 holding the panel 10; and a piezoelectric element 30 attached to the panel 10, wherein the deformation of the piezoelectric element 30 causes the panel 10 to vibrate, to transmit human body vibration sound to an object in contact with the panel 10, and the perpendicular line or normal to the main surface of the panel 10 and the surface of the piezoelectric element 30 attached to the panel 10 are not orthogonal to each other.

5 Claims, 7 Drawing Sheets

(51) Int. Cl.
    *H01L 41/09*     (2006.01)
    *H04R 1/02*     (2006.01)
    *H04R 17/00*     (2006.01)
    *B06B 1/06*     (2006.01)
    *H04M 1/02*     (2006.01)
    *H04R 17/08*     (2006.01)
    *H04R 1/00*     (2006.01)
    *H04R 7/04*     (2006.01)

(52) U.S. Cl.
    CPC ...... *H01L 41/0973* (2013.01); *H04M 1/0266* (2013.01); *H04R 1/02* (2013.01); *H04R 7/045* (2013.01); *H04R 17/00* (2013.01); *H04R 17/08* (2013.01); *H04M 1/0268* (2013.01); *H04R 1/00* (2013.01); *H04R 7/04* (2013.01); *H04R 2440/05* (2013.01); *H04R 2499/11* (2013.01)

(56) References Cited

U.S. PATENT DOCUMENTS

| | | | | |
|---|---|---|---|---|
| 8,180,065 B2 * | 5/2012 | Snider | ............ | H04R 7/04 381/86 |
| 8,340,327 B2 * | 12/2012 | Snider | ............ | H04R 7/045 381/152 |
| 2002/0027999 A1 * | 3/2002 | Azima | ............ | B42D 15/022 381/431 |
| 2004/0240687 A1 * | 12/2004 | Graetz | ............ | H04R 7/045 381/152 |
| 2006/0008099 A1 * | 1/2006 | Azima | ............ | H04R 7/045 381/191 |
| 2012/0289162 A1 * | 11/2012 | Hosoi | ............ | H04R 25/606 455/41.3 |
| 2014/0262599 A1 * | 9/2014 | Bokaemper | ............ | H04R 1/22 181/157 |
| 2015/0341714 A1 * | 11/2015 | Ahn | ............ | G06F 1/1688 381/333 |
| 2015/0373441 A1 * | 12/2015 | Behles | ............ | H01L 41/0973 381/333 |
| 2016/0147293 A1 * | 5/2016 | Park | ............ | G06F 1/1656 381/334 |

FOREIGN PATENT DOCUMENTS

| | | |
|---|---|---|
| JP | 2005-236352 A | 9/2005 |
| JP | 2006-526950 A | 11/2006 |
| JP | 2009-089435 A | 4/2009 |
| JP | 2013-017009 A | 1/2013 |
| JP | 5255142 B1 | 4/2013 |

OTHER PUBLICATIONS

International Search Report issued in PCT/JP2014/005520; dated Dec. 9, 2014.
Written Opinion issued in PCT/JP2014/005520; dated Dec. 9, 2014; with English language Concise Explanation.

\* cited by examiner

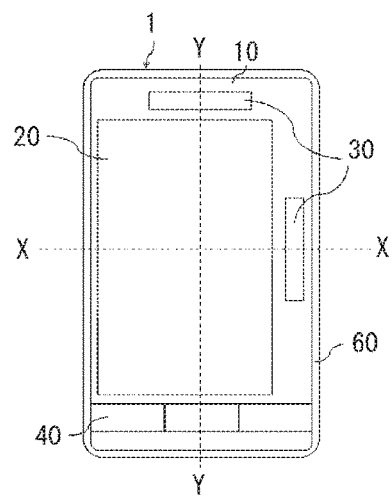

ELECTRONIC DEVICE

CROSS REFERENCE TO RELATED APPLICATION

This application claims priority to Japanese Patent Application No. 2013-225806 filed on Oct. 30, 2013 and Japanese Patent Application No. 2014-035635 filed on Feb. 26, 2014, the entire disclosures of which are incorporated herein by reference.

TECHNICAL FIELD

The disclosure relates to an electronic device that applies a predetermined electrical signal to a piezoelectric element to vibrate a panel, and transmits the vibration of the panel to the human body to convey sound to the user.

BACKGROUND

Patent Literature (PTL) 1 describes an electronic device, such as a mobile phone terminal, in which a piezoelectric element attached to a main surface of a panel is deformed to vibrate the panel, to transmit human body vibration sound to an object in contact with the panel. In PTL 1, the human body vibration sound is defined as sound that is transmitted to the auditory nerve of a user in contact with a vibrating thing, through part of the user's body (e.g. the cartilage of the external ear).

CITATION LIST

Patent Literature

PTL 1: JP 5255142 B2

SUMMARY

Technical Problem

In the electronic device described in PTL 1, a space is needed to place the piezoelectric element on the main surface of the panel. This causes an increase in panel size.

It could therefore be helpful to provide an electronic device in which a piezoelectric element is positioned so as to reduce the panel size.

Solution to Problem

An electronic device according to the disclosure includes: a panel; a housing holding the panel; and a piezoelectric element attached to the panel, wherein deformation of the piezoelectric element causes the panel to vibrate, to transmit human body vibration sound to an object in contact with the panel, and a perpendicular line to a main surface of the panel and a virtual plane including a main surface of the piezoelectric element are not orthogonal to each other.

The panel may have at least a curved portion or a bent portion.

The panel may have the curved portion or the bent portion at an end of the main surface of the panel, and have a second surface that extends from the curved portion or the bent portion.

The piezoelectric element may be attached to the curved portion or the bent portion.

The piezoelectric element may be attached to the second surface.

An end of the panel at which the piezoelectric element is attached may be joined to the housing, to form a fixed end.

An electronic device according to the disclosure includes: a panel; a display unit; a housing holding the panel and the display unit; and a piezoelectric element attached to the panel, wherein deformation of the piezoelectric element causes the panel to vibrate, to transmit human body vibration sound to an object in contact with the panel, and a perpendicular line to a main surface of the display unit and a virtual plane including a main surface of the piezoelectric element are not orthogonal to each other.

The panel may have an area not orthogonal to the perpendicular line to the main surface of the display unit, directly above the display unit.

The panel may have a polyhedral shape or a curved surface shape.

An electronic device according to the disclosure includes: a housing; a panel attached to the housing; and a piezoelectric element attached to the panel, wherein deformation of the piezoelectric element causes the panel to vibrate, to transmit human body vibration sound to an object in contact with the panel, and when the panel is removed from the housing and placed on a horizontal plane, the horizontal plane and a virtual plane including a main surface of the piezoelectric element intersect at a predetermined angle.

The panel may have a convex curved surface with an intermediate area protruding more than both ends, in a predetermined section of the panel, and when the panel is placed on the horizontal plane with the intermediate area being higher than the ends, the horizontal plane and the virtual plane including the main surface of the piezoelectric element may intersect at the predetermined angle.

The panel may have a convex curved shape.

The panel may have a concave curved shape.

At least a part of the housing may have a convex curved shape.

At least a part of the housing may have a concave curved shape.

Advantageous Effect

It is possible to provide an electronic device in which a piezoelectric element is positioned so as to reduce the size of the electronic device.

BRIEF DESCRIPTION OF THE DRAWINGS

In the accompanying drawings:

FIG. 10A is a front view of an electronic device according to another one of the disclosed embodiments;

FIG. 10B is a diagram illustrating examples of the shape of the panel in FIG. 10A; and FIG. 10C is a diagram illustrating examples of the shape of the panel in FIG. 10A.

DETAILED DESCRIPTION

Figure 1:
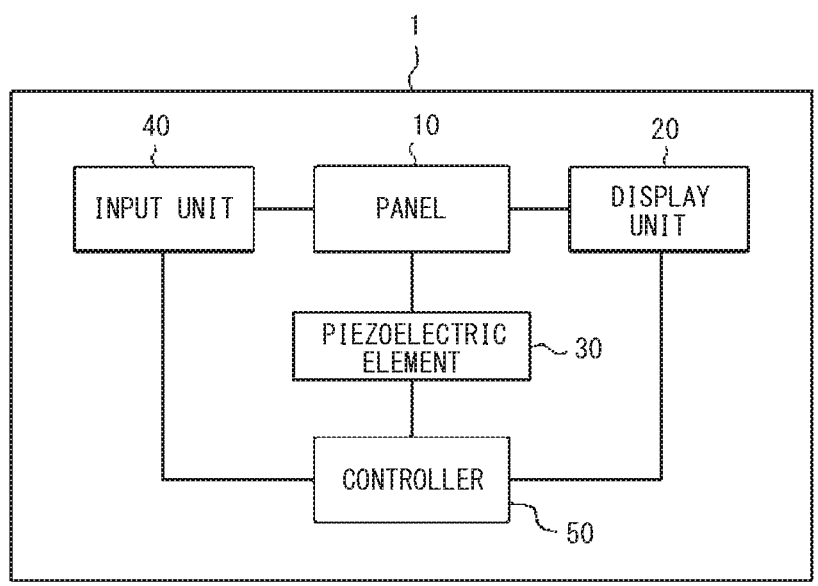
FIG. 1 is a functional block diagram of an electronic device according to one of the disclosed embodiments.

The following describes the disclosed embodiments in detail with reference to drawings. FIG. 1 is a functional block diagram of an electronic device 1 according to one of the disclosed embodiments. The electronic device 1 is a mobile phone (smartphone) as an example, and includes a panel 10, a display unit 20, a piezoelectric element 30, an input unit 40, and a controller 50.

The panel 10 is made of glass or a synthetic resin such as acrylic. In the case where the panel 10 is a touch panel, the panel 10 detects the contact of a user's finger, pen, stylus pen, etc. The method of detection by the touch panel may be any method such as capacitance, resistive, surface acoustic wave (or ultrasonic), infrared, electromagnetic induction, or load sensing.

The display unit 20 is a display device such as a liquid crystal display, an organic EL display, or an inorganic EL display. The display unit 20 is positioned on the back of the panel 10. The display unit 20 is placed on the back of the panel 10 using the below-mentioned joining member 70 (e.g. adhesive). The display unit 20 may be separated from the panel 10 and supported by the housing of the electronic device 1.

The piezoelectric element 30 is an element that, when an electrical signal (voltage) is applied, expands/contracts or bends according to the electromechanical coupling coefficient of the constituent material. Such an element is made of ceramic or crystal as an example. The piezoelectric element 30 may be a unimorph, bimorph, or stacked piezoelectric element. The stacked piezoelectric element includes a stacked bimorph element formed by stacking bimorphs (for example, stacking 16 layers or 24 layers). The stacked piezoelectric element is a stacked structure of a plurality of dielectric layers made of lead zirconate titanate (PZT) and electrode layers between the plurality of dielectric layers. When an electrical signal (voltage) is applied, the stacked piezoelectric element undergoes displacement of deflection in the direction in which the layers are stacked, i.e. the thickness direction.

The input unit 40 receives operation input from the user, and includes operation buttons (operation keys) as an example. In the case where the panel 10 is a touch panel, the panel 10 can also receive operation input from the user by detecting the contact of the user.

The controller 50 is a processor that controls the electronic device 1. The controller 50 applies a predetermined electrical signal (a voltage corresponding to a sound signal) to the piezoelectric element 30. The voltage applied to the piezoelectric element 30 by the controller 50 may be, for example, ±15 V that is higher than ±5 V which is a voltage applied to a panel speaker intended for sound conduction of not human body vibration sound but air conduction sound. Hence, even in the case where the user presses the panel 10 against his or her body with a force of 3 N or more as an example (e.g. a force of 5 N to 10 N), the panel 10 vibrates sufficiently, thus generating human body vibration sound transmitted through part of the user's body. The level of the applied voltage can be adjusted as appropriate, depending on the strength with which the panel 10 is fixed to the housing or a support member or the performance of the piezoelectric element 30. When the controller 50 applies an electrical signal to the piezoelectric element 30, the piezoelectric element 30 undergoes displacement of deflection in the thickness direction. The panel 10 to which the piezoelectric element 30 is attached deforms with the displacement of the piezoelectric element 30, and vibrates. The panel 10 thus generates air conduction sound. The panel 10 also transmits human body vibration sound to an object in contact with the panel 10. The object is, for example, part of the user's body (e.g. the cartilage of the external ear). For example, the controller 50 applies, to the piezoelectric element 30, an electrical signal corresponding to a sound signal relating to the voice of the other party in communication, to generate the air conduction sound and human body vibration sound corresponding to the sound signal. The sound signal may relate to a ringing tone or melody, music such as a song, etc. The sound signal corresponding to the electrical signal may be based on music data stored in internal memory of the electronic device 1, or music data stored in an external server or the like and played via a network.

Figure 2A:
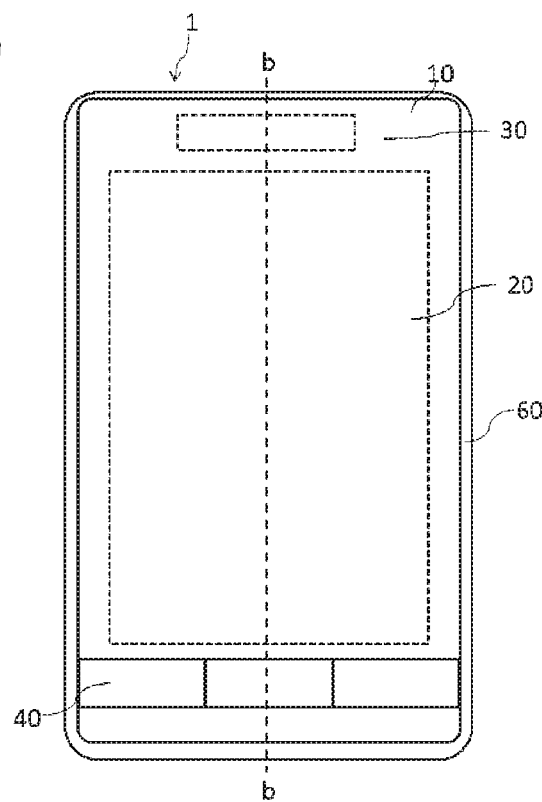
FIG. 2A is a diagram illustrating the structure of the electronic device according to the embodiment.
Figure 2B:
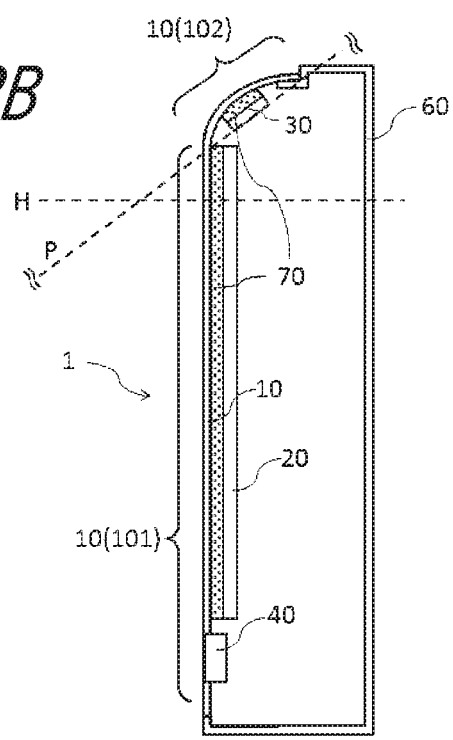
FIG. 2B is a sectional view taken along line b-b in FIG. 2A.

FIGS. 2A and 2B are diagrams illustrating the structure of the electronic device 1 according to the embodiment. FIG. 2A is a front view of the electronic device 1, and FIG. 2B is a sectional view of the electronic device 1 in FIG. 2A along the longer-side direction (line b-b). The electronic device 1 illustrated in FIGS. 2A and 2B is a substantially rectangular smartphone that has a touch panel as the panel 10 on the front of the electronic device 1. The panel 10 and the input unit 40 are supported by a housing 60, and the display unit 20 and the piezoelectric element 30 are each bonded to the panel 10 with a joining member 70. The display unit 20 and the piezoelectric element 30 are each substantially rectangular.

The panel 10 is partly curved. In FIG. 2B, the panel 10 has a substantially rectangular main surface portion 101 (first surface) forming the front of the electronic device 1, and a curved portion 102 extending from one end (the upper side of the electronic device 1) of the main surface portion 101 in the longer-side direction toward the back of the electronic device 1. The curved portion 102 may be formed not from the upper end but from the lower end of the main surface portion 101, and may be formed from an end of the main surface portion 101 in the shorter-side direction. The curved portion 102 may be formed from a plurality of ends from among the four sides of the main surface portion 101 of the panel 10. The curved portion 102 of the panel 10 may extend from the end of the main surface portion 101 not toward the back of the electronic device 1 but away from the back of the electronic device 1.

The panel 10 is held by the housing 60. In this embodiment, the edges of the main surface of the panel 10 and/or the sides of the panel 10 are joined to the housing 60 with the joining member 70. The joining member 70 is an adhesive or double-faced tape which is thermosetting, ultraviolet curable, or the like. The joining member 70 may be an optical elastomeric resin which is a colorless and transparent acrylic ultraviolet curable adhesive, as an example. The joining member 70 may also serve as waterproof tape enabling the waterproof structure of the electronic device 1.

The piezoelectric element 30 is attached to the surface of the curved portion 102 of the panel 10 inside the electronic device 1, with the joining member 70. Here, attaching the piezoelectric element 30 to the curved portion 102 includes attaching the piezoelectric element 30 to the curved portion 102 with the joining member 70 in between. Attaching the piezoelectric element 30 to the curved portion 102 also includes attaching the piezoelectric element 30 to the curved portion 102 with an intermediate member or the like in between.

The piezoelectric element 30 is attached to the curved portion 102 of the panel 10 with the joining member 70. In the case where the curved portion 102 of the panel 10 has a large curvature, a temporarily flowable adhesive such as an ultraviolet curable resin may be solidified in the gap between the curved portion 102 and the piezoelectric element 30. With such a method, the piezoelectric element 30 can be attached to the curved portion 102 of the panel 10 without leaving any space between the piezoelectric element 30 and the curved portion 102. This facilitates the transmission of the vibration of the piezoelectric element 30 to the panel 10. Here, the whole area of the predetermined surface of the piezoelectric element 30 does not need to be attached to the panel 10, as long as at least both ends of the predetermined surface are attached to the panel 10. A plastic intermediate member formed to have a curved surface with the same shape as the curved portion 102 and a flat surface to which the piezoelectric element 30 is to be attached may be placed between the curved portion 102 and the piezoelectric element 30, to allow the piezoelectric element 30 to be attached to the curved portion 102 with double-faced tape. Alternatively, the surface of the curved portion 102 of the panel 10 inside the electronic device 1 may be flattened to facilitate the attachment of the piezoelectric element 30 to the curved portion 102.

The main surface of the piezoelectric element 30 is attached to the curved portion 102 of the panel 10. Since the curved portion 102 of the panel 10 is not in parallel with the main surface portion 101, the main surface of the piezoelectric element 30 attached to the curved portion 102 is not in parallel with the main surface portion 101, either. In other words, the piezoelectric element 30 is positioned so that the perpendicular line H to the main surface portion 101 of the panel 10 and the virtual plane P including the main surface of the piezoelectric element 30 are not orthogonal to each other.

Figure 3:
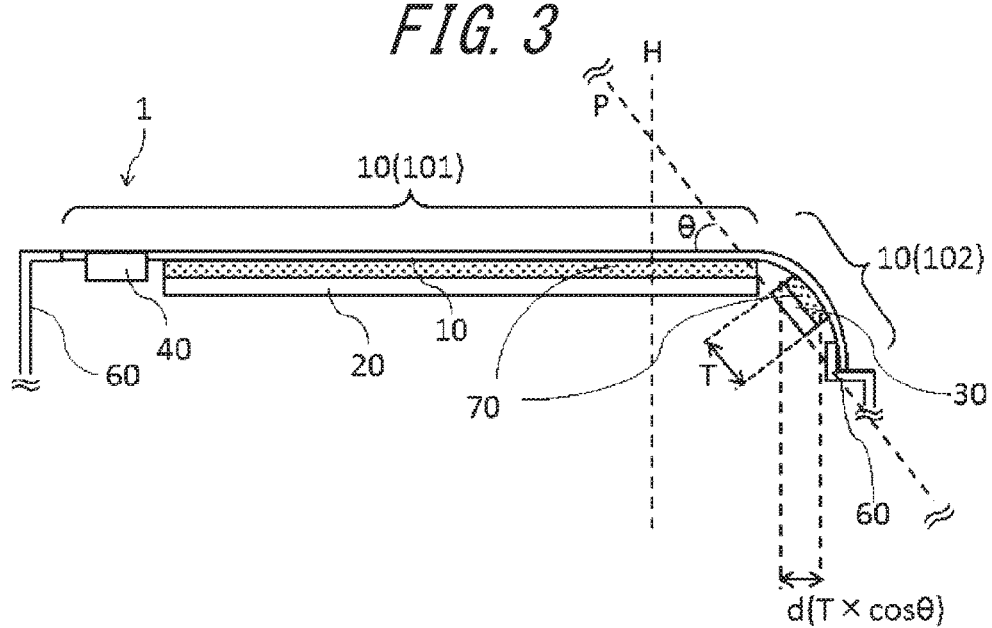
FIG. 3 is a diagram illustrating the structure of the electronic device according to the embodiment and a conventional electronic device.

FIG. 3 is a sectional view illustrating the detailed structure of the electronic device according to the embodiment. FIG. 3 is a diagram illustrating, when the main surface portion 101 of the panel 10 in the electronic device 1 is assumed as a horizontal plane and the shorter side of the main surface (i.e. the surface attached to the panel 10) of the piezoelectric element 30 is projected on the horizontal plane, the width d of the projected shorter side. Let T be the length of the shorter side of the main surface of the piezoelectric element 30, and $\theta$ be the angle between the virtual plane P including the main surface of the piezoelectric element 30 and the main surface portion 101 of the panel 10. The width d of the piezoelectric element 30 is expressed by the absolute value of $T \times \cos\theta$. The width d of the piezoelectric element 30 thus indicates the area occupied by the piezoelectric element 30 in the dimension along the longer side of the main surface of the electronic device 1. In FIG. 3, the virtual plane P including the main surface of the piezoelectric element 30 is not orthogonal to the perpendicular line H to the main surface portion 101 of the panel 10. Accordingly, the angle $\theta$ between the virtual plane P including the main surface of the piezoelectric element 30 and the main surface portion 101 of the panel 10 is not 0, so that d<T. In the case where the panel 10 has no curved portion and is composed of only the main surface portion 101 and the piezoelectric element 30 is attached to one end of the main surface portion 101, on the other hand, the angle $\theta$ between the virtual plane P including the main surface of the piezoelectric element 30 and the main surface portion 101 of the panel 10 is 0. In such a case, d0=T, where d0 is the width of the shorter side of the main surface (i.e. the surface attached to the panel 10) of the piezoelectric element 30 when the shorter side is projected on the horizontal plane. Thus, the width d of the piezoelectric element 30 in the electronic device 1 according to this embodiment is smaller than the width d0 of the piezoelectric element in the case where the piezoelectric element 30 is attached to the main surface portion 101 of the panel 10 that is composed of only the main surface portion 101.

As described above, in the electronic device 1 according to this embodiment, the piezoelectric element 30 is attached to the curved portion 102 of the panel 10. Such an electronic device 1 can be reduced in size, because the area occupied by the piezoelectric element 30 in the dimension along the longer side of the main surface of the electronic device 1 is smaller than in the case where the piezoelectric element 30 is attached to the main surface portion 101.

Typically, in an electronic device having a piezoelectric element on the back of a panel, a light shielding film is printed in the area of the panel where the piezoelectric element is visible, in order to prevent the piezoelectric element from being visible to the user. In the electronic device 1 according to the disclosure, the area occupied by the piezoelectric element 30 in the main surface portion 101 of the electronic device 1 is reduced, and so the area in which the light shielding film is provided can be reduced.

The aforementioned advantageous effects are achieved by positioning the piezoelectric element 30 so that the virtual plane including the main surface of the piezoelectric element 30 is not orthogonal to the perpendicular line to the main surface portion 101 of the panel 10. Such positioning of the piezoelectric element is easily realized by using the panel 10 having a curved portion and attaching the piezoelectric element to the curved portion as in this embodiment.

In the electronic device 1 according to this embodiment, the deformation of the piezoelectric element 30 attached to the panel 10 causes the panel 10 to vibrate, to transmit air conduction sound and human body vibration sound to an object in contact with the vibrating panel 10. The curved portion 102 of the panel 10 vibrates in the direction intersecting with the curved portion 102, due to the deformation of the piezoelectric element 30. The vibration of the curved portion 102 of the panel 10 also propagates to the main surface portion 101 integral with the curved portion 102. Therefore, the electronic device 1 can transmit human body vibration sound in both of the main surface portion 101 and curved surface portion 102 of the panel 10.

Moreover, in the case where the electronic device 1 outputs the same volume of sound as a conventional dynamic receiver, sound transmitted to the surroundings of the electronic device 1 by the vibration of air due to the vibration of the panel 10 is not loud as compared with the dynamic receiver. The electronic device 1 is therefore suitable when, for example, listening to a recorded message on a train or the like.

In the case where the electronic device 1 does not additionally include a dynamic receiver, an opening (sound emission opening) for sound transmission need not be formed in the housing, with it being possible to simplify the waterproof structure of the electronic device 1. In the case where the electronic device 1 includes a dynamic receiver, on the other hand, a sound emission opening may be blocked by a member that allows the passage of gas but does not allow the passage of liquid. An example of the member that allows the passage of gas but does not allow the passage of liquid is Gore-Tex® (Gore-Tex is a registered trademark in Japan, other countries, or both).

Figure 4:
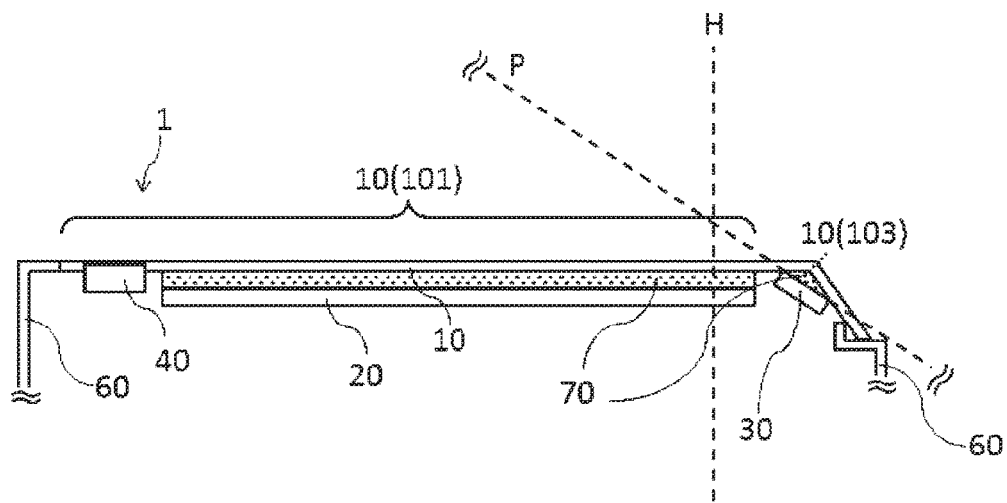
FIG. 4 is a diagram illustrating a first modification to the embodiment.

FIG. 4 is a diagram illustrating a first modification to the embodiment. The panel 10 in the electronic device 1 has the substantially rectangular main surface portion 101 forming the front of the electronic device 1, and a bent portion 103 continuous from one end (the upper side of the electronic device 1) of the main surface portion 101 in the longer-side direction and bent at a predetermined angle with respect to the main surface portion 101 toward the back of the electronic device 1. The end of the bent portion 103 is joined to the housing 60 with the joining member 70, and forms part of the upper side surface of the electronic device 1. The bending angle of the bent portion 103 and the like are set as appropriate. The bent portion 103 may be formed not from the upper end but from the lower end of the main surface portion 101, and may be formed from an end of the main surface portion 101 in the shorter-side direction. The bent portion 103 may be formed from a plurality of ends from among the four sides of the main surface portion 101 of the panel 10. The bent portion 103 of the panel 10 may be formed in such a manner that the end of the panel 10 is bent at the predetermined angle not toward the back of the electronic device 1 but toward the side opposite to the back of the electronic device 1.

The piezoelectric element 30 is attached to the surface of the bent portion 103 of the panel 10 inside the electronic device 1, with the adhesive (the joining member 70). When the piezoelectric element 30 is placed in this way, the main surface of the piezoelectric element 30 is not in parallel with the main surface portion 101 of the panel 10. In other words, the piezoelectric element 30 is positioned so that the perpendicular line H to the main surface of the panel 10 and the virtual plane P including the main surface of the piezoelectric element 30 are not orthogonal to each other. Thus, the area occupied by the piezoelectric element 30 in the dimension along the longer side of the main surface of the electronic device 1 can be reduced in this modification, too.

Figure 5:
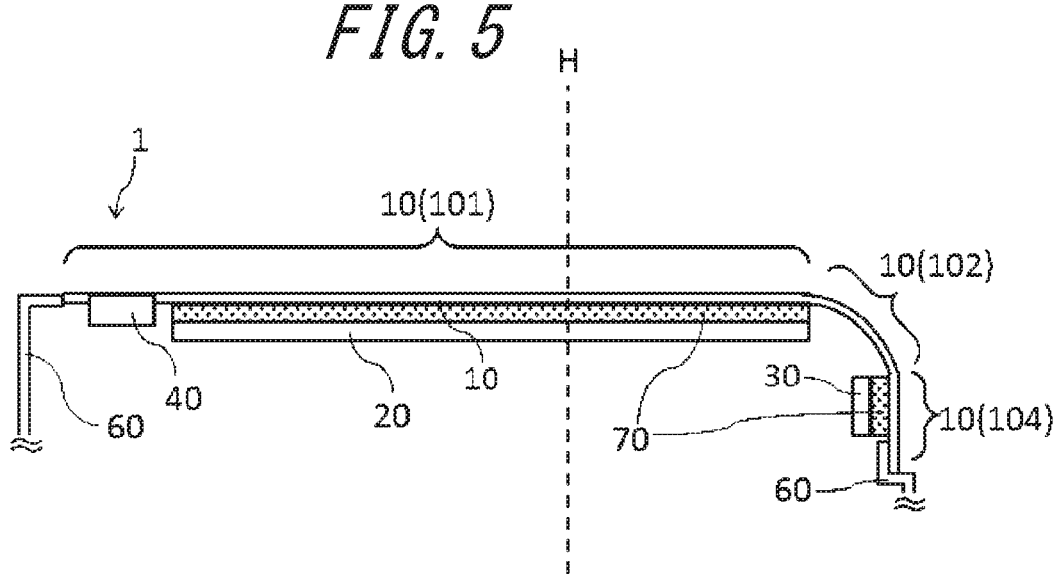
FIG. 5 is a diagram illustrating a second modification to the embodiment.

FIG. 5 is a diagram illustrating a second modification to the embodiment. The panel 10 in the electronic device 1 has the main surface portion 101, the curved portion 102 formed by curving one end of the main surface portion 101, and a second surface 104 on the panel extending from the curved portion 102. The second surface 104 of the panel 10 is substantially plate-shaped, and is substantially perpendicular to the main surface portion 101 of the panel 10. The end of the second surface 104 of the panel 10 is joined to the housing 60 with the joining member 70. In this modification, the curved portion 102 and second surface 104 of the panel 10 form part of the side surface of the electronic device 1.

The piezoelectric element 30 is attached to the second surface 104 of the panel 10. Since the second surface 104 is substantially perpendicular to the main surface portion 101, the main surface of the piezoelectric element 30 is substantially perpendicular to the main surface portion 101, too. In this case, the area occupied by the piezoelectric element 30 in the surface area of the main surface portion 101 in the electronic device 1 is equal to the thickness of the piezoelectric element 30. As in the embodiment, such an electronic device 1 can be reduced in size, because the area occupied by the piezoelectric element 30 in the dimension along the longer side of the main surface of the electronic device 1 is smaller than in a conventional electronic device in which the piezoelectric element 30 is attached to the main surface portion 101. Although the second surface 104 and main surface portion 101 of the panel 10 are substantially perpendicular to each other in this modification, this is not a limitation, and the positioning of the piezoelectric element 30 according to the disclosure can be realized by any structure in which the second surface 104 and the main surface portion 101 are not in parallel with each other.

Although the piezoelectric element 30 is attached to the second surface 104 of the panel 10 in the electronic device 1 according to the second modification, an intended reduction in size of the electronic device can still be achieved even when the piezoelectric element 30 is attached not to the second surface 104 but to the curved portion 102 of the panel 10 as in the structure in FIG. 2. However, since the second surface 104 in this modification is substantially plate-shaped, attaching the main surface of the piezoelectric element 30 to the second surface 104 is easier than attaching the main surface of the piezoelectric element 30 to the curved portion 102.

Figure 6:
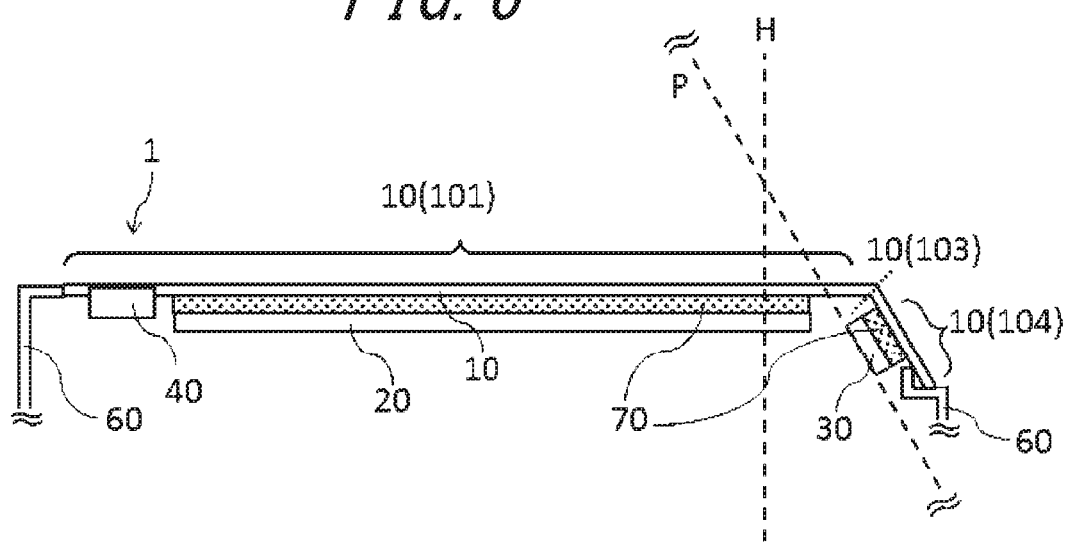
FIG. 6 is a diagram illustrating a third modification to the embodiment.

FIG. 6 is a diagram illustrating a third modification to the embodiment. The panel 10 in the electronic device 1 has the main surface portion 101, the bent portion 103 formed by bending one end of the main surface portion 101, and the second surface 104 on the panel extending from the bent portion 103. The second surface 104 of the panel 10 is substantially plate-shaped, and the end of the second surface 104 is joined to the housing 60 with the joining member 70. In this modification, the second surface 104 of the panel 10 forms part of the side surface of the electronic device 1.

The main surface of the piezoelectric element 30 is attached to the second surface 104 of the panel 10. Since the second surface 104 is bent at the predetermined angle from the main surface portion 101, the main surface of the piezoelectric element 30 attached to the second surface 104 and the main surface portion 101 of the panel 10 are not in parallel with each other.

In other words, the virtual plane P including the main surface of the piezoelectric element 30 is not orthogonal to the perpendicular line H to the main surface portion 101 of the panel 10. The electronic device 1 according to this modification can be reduced in size, too, because the area occupied by the piezoelectric element 30 in the dimension along the longer side of the main surface of the electronic device 1 is smaller.

Although the piezoelectric element 30 is attached to the second surface 104 of the panel 10 in the electronic device 1 according to the third modification, an intended reduction in size of the electronic device can still be achieved even when the piezoelectric element 30 is attached not to the second surface 104 but to the bent portion 103 of the panel 10 as in the structure in FIG. 4. However, since the second surface 104 in this modification is substantially plate-shaped, attaching the main surface of the piezoelectric element 30 to the second surface 104 is easier than attaching the main surface of the piezoelectric element 30 to the bent portion 103.

In the embodiment and modifications described above, the end of the panel 10 at which the piezoelectric element 30 is attached is joined to the housing 60, thus forming a fixed end. In the electronic device 1 having such a structure, the propagation of the vibration to the panel 10 resulting from the deformation of the piezoelectric element 30 is stable, and any distortion of vibration sound is suppressed.

Alternatively, part of the end of the panel 10 at which the piezoelectric element 30 is attached in the electronic device 1 may not be joined to the housing 60 so that the end of the panel 10 is a free end.

Figure 7:
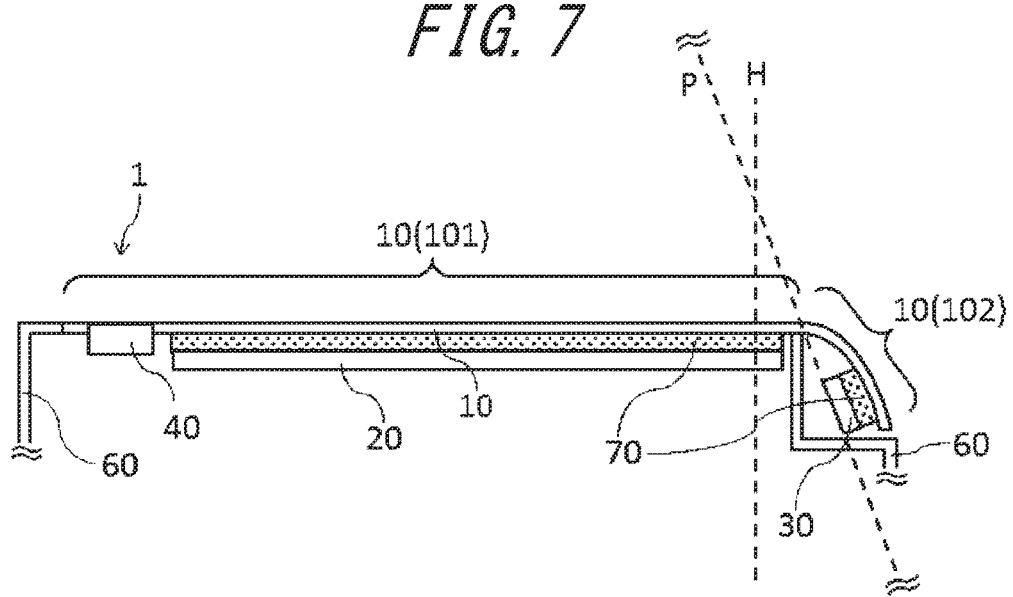
FIG. 7 is a diagram illustrating a fourth modification to the embodiment.

FIG. 7 is a diagram illustrating a fourth modification to the embodiment. FIG. 7 illustrates a structure in the case where the end of the panel 10 at which the piezoelectric element 30 is attached is a free end. In this structure, the panel 10 has the main surface portion 101, and the curved portion 102 formed by curving one end of the main surface portion 101. The main surface portion 101 of the panel 10 is joined to the upper part of the housing 60 in the electronic device 1 with the joining member 70, while the end of the curved portion 102 is not joined to the housing 60. The piezoelectric element 30 is attached to the curved portion 102 of the panel 10. With such a structure, the end of the panel 10 at which the piezoelectric element 30 is attached is a free end. Here, the end of the curved portion 102 means the end surface of the curved portion 102, the side surfaces near the end surface, and the edges of the main surface of the curved portion 102. Joining none of these parts to the housing 60 is not essential to make the end of the panel 10 a free end, and a joined part may be provided as appropriate. A structure in which not only the end of the curved portion 102 but also the whole area of the curved portion 102 is not joined to the housing 60 is also possible.

In the electronic device 1 according to this modification, the end of the panel 10 at which the piezoelectric element 30 is attached is a free end. Hence, the amplitude of the vibration of the panel 10 resulting from the deformation of the piezoelectric element 30 is greater than in the case where the end is a fixed end. This contributes to higher sound pressure.

Although the panel 10 in the electronic device 1 has the plate-shaped main surface portion 101 in the embodiment and modifications described above, this is not a limitation. The panel 10 may be composed of only a curved surface portion without a plate-shaped portion.

Figure 8:
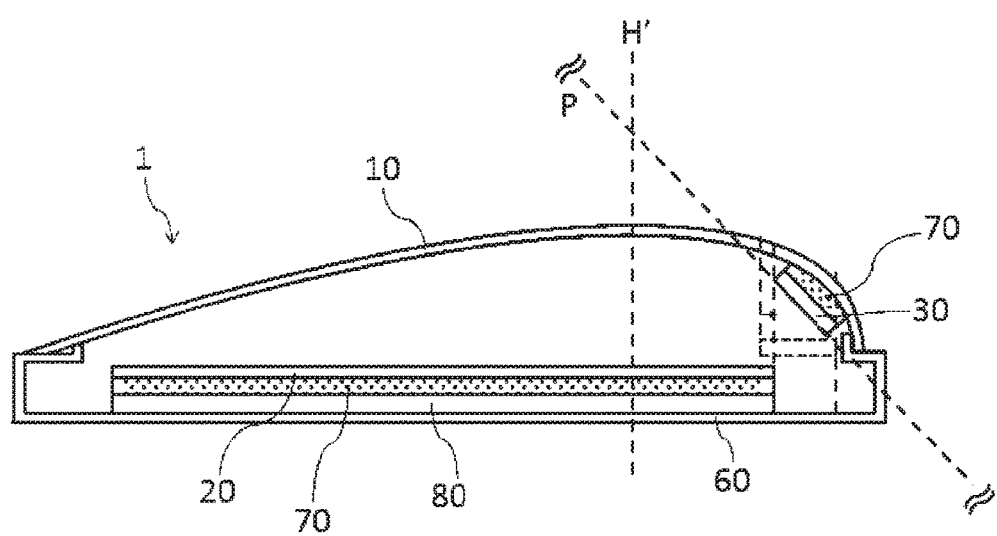
FIG. 8 is a diagram illustrating a fifth modification to the embodiment.

FIG. 8 is a diagram illustrating a fifth modification to the embodiment. FIG. 8 illustrates the electronic device 1 having a dome-shaped curved panel on the front of the housing 60. In this modification, the display unit 20 is not bonded to the panel 10 but supported by the housing 60. Thus, in the electronic device 1 according to this modification, the display unit 20 and the panel 10 are separate from each other, and the display unit 20 and a support unit 80 which is part of the housing 60 are bonded together with the joining member 70. The support unit 80 may be not part of the housing 60, but a member independent of the housing 60 and made of metal, resin, or the like.

The piezoelectric element 30 is attached to the surface of the end of the panel 10 inside the electronic device 1, with the joining member 70. The piezoelectric element 30 is positioned so that the perpendicular line H' to the main surface of the display unit 20 and the virtual plane P including the main surface of the piezoelectric element 30 are not orthogonal to each other. By such positioning, the area occupied by the piezoelectric element 30 in the dimension along the longer side of the main surface of the electronic device 1 is smaller than in the case where the perpendicular line H' and the virtual plane P are orthogonal to each other, i.e. in the case where the main surface of the display unit 20 and the main surface of the piezoelectric element 30 are in parallel with each other. In FIG. 8, the piezoelectric element 30 based on the assumption that the main surface of the piezoelectric element 30 and the main surface of the display unit 20 are in parallel with each other is indicated by dotted lines, and the difference between the area occupied by the piezoelectric element 30 according to this modification and the area occupied by the piezoelectric element indicated by dotted lines in the main surface of the electronic device 1 is indicated by arrow.

Typically, image display by the display unit cannot be performed in the area occupied by the piezoelectric element in the main surface of the electronic device. By positioning the piezoelectric element 30 so as to reduce the area occupied by the piezoelectric element 30 in the main surface of the electronic device 1 as in this modification, the display area by the display unit can be increased.

The fifth modification to the embodiment is also applicable in the case where the panel 10 has, directly above the display unit 20, an area not orthogonal to the perpendicular line H' to the main surface of the display unit 20. Examples of the shape of such a panel 10 include a polyhedral shape and a curved surface shape such as a semispherical shape, a semielliptical shape, or a shape obtained by vertically halving a droplet shape (or an oval shape, etc.).

Figure 9A:
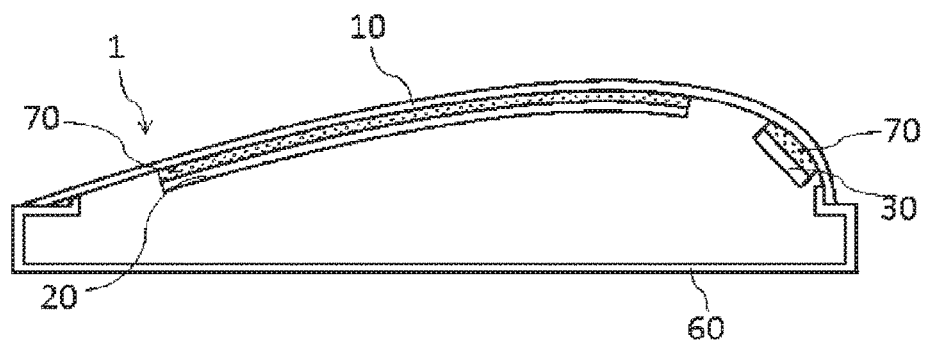
FIG. 9A is a sectional view of an electronic device according to another one of the disclosed embodiments.
Figure 9B:
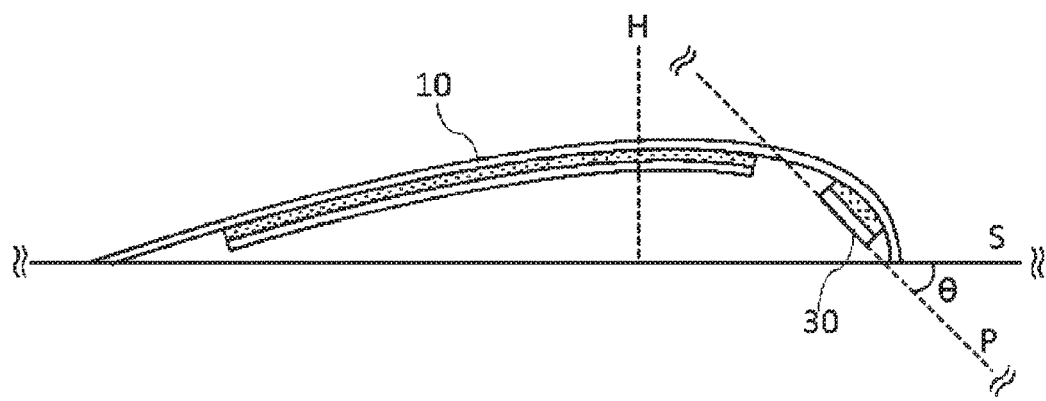
FIG. 9B is a sectional view of the panel in FIG. 9A.

FIGS. 9A and 9B are diagrams illustrating another one of the disclosed embodiments. FIG. 9A is a sectional view of the electronic device 1, and FIG. 9B is a sectional view of the panel 10 when the panel 10 is removed from the housing 60 of the electronic device 1 and placed on a horizontal plane. The panel 10 is attached to the housing 60 in the electronic device 1 according to this embodiment, as illustrated in FIG. 9A. The panel 10 has a convex curved surface with an intermediate area protruding more than both ends, in a predetermined section of the panel 10. The display unit 20 is attached to the panel 10 with the joining member 70. The piezoelectric element 30 is also attached to the panel 10 with the joining member 70. In the electronic device 1 according to this embodiment, the deformation of the piezoelectric element 30 causes the panel 10 to vibrate, to transmit human body vibration sound to an object in contact with the panel 10. Note that the input unit 40 in the electronic device 1 according to this embodiment is not illustrated here, as in the electronic device 1 in FIG. 8.

When the panel 10 is removed from the housing 60 and placed on the horizontal plane S, the horizontal plane S and the virtual plane P including the main surface of the piezoelectric element 30 intersect at a predetermined angle θ, as illustrated in FIG. 9B. The panel 10 has a convex curved surface with an intermediate area protruding more than both ends in a predetermined section of the panel 10, as mentioned above. In FIG. 9B, the panel 10 is placed on the horizontal plane with the intermediate area being higher than both ends of the panel 10. In the case where the user views an image displayed via the panel 10 by the display unit 20 in the electronic device 1, the user typically views the display area of the electronic device 1 from above the electronic device 1 in the direction H perpendicular to the horizontal plane S. This surface viewed by the user is substantially in parallel with the horizontal plane S. In the electronic device 1, the piezoelectric element 30 is attached to the panel 10 so that the virtual plane P including the main surface of the piezoelectric element 30 and the horizontal plane S intersect at the predetermined angle. In this case, the area occupied by the piezoelectric element 30 in the horizontal plane S, i.e. the plane substantially in parallel with the surface viewed by the user when he or she views the display area, is smaller than in the case where the virtual plane P and the horizontal plane S do not intersect at the predetermined angle (i.e. the virtual plane P and the horizontal plane S are in parallel with each other). Hence, for example, an area in which a light shielding film for preventing the piezoelectric element 30 from being visible to the user is provided can be reduced.

The panel 10 in the electronic device 1 may have a curved surface shape, as mentioned above. FIGS. 10A, 10B, and 10C are diagrams illustrating examples of the shape of the panel 10. FIG. 10A is a front view of the electronic device 1, and FIGS. 10B and 10C each illustrate a section of the electronic device 1 in FIG. 10A for each pattern of the shape of the panel 10. In FIG. 10A, the piezoelectric element 30 is attached to at least one of an end of the panel 10 in the longer-side direction of the electronic device 1 and an end of the panel 10 in the shorter-side direction of the electronic device 1. FIG. 10B illustrates a section of the panel 10 in the shorter-side direction (line X-X) of the electronic device 1 and a section of the panel 10 in the longer-side direction (line Y-Y) of the electronic device 1, for each pattern of the shape of the panel 10. In FIG. 10B, the panel 10 is indicated by solid lines, the housing 60 is indicated by dashed lines, and the piezoelectric element 30 is indicated by diagonal lines. The input unit 40 is not illustrated. Pattern 1 in FIG. 10B corresponds to the case where the panel 10 has a curved shape with an intermediate area protruding more than both ends of the panel 10 in both the section along line X-X and the section along line Y-Y of the electronic device 1. Pattern 2 in FIG. 10B corresponds to the case where the panel 10 has a curved shape with an intermediate area protruding more than both ends of the panel 10 in the section along line X-X of the electronic device 1. Pattern 3 in FIG. 10B corresponds to the case where the panel 10 has a curved shape with an intermediate area protruding more than both ends of the panel 10 in the section along line Y-Y of the electronic device 1. The panel 10 illustrated in FIG. 10B has a surface inclined in curved shape. Accordingly, when the electronic device 1 is placed on a flat surface on its back so that the panel 10 faces up, an image displayed by the display unit 20 is easily visible even in the case of viewing the image from an angle.

FIG. 10C is a diagram illustrating other examples of the shape of the panel 10. In patterns 1 to 4 in FIG. 10C, the panel 10 has a convex curved shape in at least one of the section along line X-X and the section along line Y-Y of the electronic device 1. Pattern 1 in FIG. 10C is the same as the example in FIG. 10B, and corresponds to the case where the panel 10 is line-symmetric with respect to the normal to the center part of the panel 10. Pattern 2 in FIG. 10C corresponds to the case where the panel 10 is asymmetric with respect to the normal to the center part of the panel 10. Such a shape of the panel 10 is obtained, for example, by vertically halving a droplet shape (or an oval shape, etc.). In the case where the panel 10 is shaped like a flat plate, when the electronic device 1 is placed so that the panel 10 is in contact with a predetermined flat surface, light emitted from the display unit 20 for notification or the like does not leak to the outside, and so is less visible. In the case where the panel 10 has a convex curved shape, on the other hand, even when the electronic device 1 is placed on a flat surface with the panel 10 facing down, there is a clearance between the curved surface of the panel 10 and the flat surface. Accordingly, light emitted from the display unit 20 easily leaks to the outside, and so is more visible. Although the surface of the housing 60 forming the back of the electronic device 1 is a flat surface in patterns 1 and 2 in FIG. 10C, this is not a limitation. Patterns 3 and 4 in FIG. 10C correspond to the case where the housing 60 has a curved surface shape along the curved surface shape of the panel 10 in patterns 1 and 2 in FIG. 10C, respectively. In this case, at least a part of the housing 60, e.g. the surface of the housing 60 forming the back of the electronic device 1, has a concave curved shape. In the case where the piezoelectric element 30 is attached to the back (the housing 60) of the electronic device 1 and the user listens to phone voice or the like through the vibration of the housing 60, the user presses the back of the electronic device 1 against the side of his or her head. The concave surface of the panel fits well on the side of the user's head, exhibiting higher usability.

Although the panel 10 has a convex curved shape in patterns 1 to 4 in FIG. 10C, this is not a limitation. Patterns 5 to 8 in FIG. 10C correspond to the case where the panel 10 has a concave curved shape in at least one of the section along line X-X and the section along line Y-Y of the electronic device 1. Pattern 5 in FIG. 10C corresponds to the case where the panel 10 is line-symmetric with respect to the normal to the center part of the panel 10. Pattern 6 in FIG. 10C corresponds to the case where the panel 10 is asymmetric with respect to the normal to the center part of the panel 10. The panel 10 thus has a concave curved shape. When listening to phone voice or the like through human body vibration sound resulting from the vibration of the panel 10, the user presses the panel 10 of the electronic device 1 against the side of his or her head. The concave surface of the panel 10 fits well on the side of the user's head, exhibiting higher usability than in the case where the panel 10 has a flat shape. Although the surface of the housing 60 forming the back of the electronic device 1 is a flat surface in patterns 5 and 6 in FIG. 10C, this is not a limitation. Patterns 7 and 8 in FIG. 10C correspond to the case where the housing 60 has a curved surface shape along the curved surface shape of the panel 10 in patterns 5 and 6 in FIG. 10C, respectively. In this case, at least a part of the housing 60, e.g. the surface of the housing 60 forming the back of the electronic device 1, has a convex curved shape. Since at least a part of the housing 60, e.g. the surface of the housing 60 forming the back of the electronic device 1, has a convex curved shape, the electronic device 1 fits well in the user's palm when he or she holds the electronic device 1, exhibiting higher usability.

Although the disclosed devices have been described by way of the drawings and embodiments, various changes or modifications may be easily made by those of ordinary skill in the art based on the disclosure. Such various changes or modifications are therefore included in the scope of the disclosure. All technical matters disclosed herein may be rearranged without inconsistency, and a plurality of components, steps, etc. may be combined into one component, step, etc. and a component, step, etc. may be divided into a plurality of components, steps, etc.

Although the foregoing embodiments and modifications describe the case where a curved panel having a curved surface portion such as a curved portion is used so that the virtual plane including the main surface of the piezoelectric element 30 is not orthogonal to the perpendicular line to the main surface of the electronic device 1, the shape of the panel is not limited to such. For example, even in the case where a substantially rectangular panel forming only the main surface of the electronic device 1 is used, the positioning of the piezoelectric element according to the disclosure can be realized by a method such as interposing an intermediate member between the piezoelectric element and the panel. The intermediate member may be rigid plastic such as polyethylene, or an elastic polymer such as rubber or silicone. The adhesive or the like used as the joining member 70 may serve as the intermediate member. The use of rigid plastic facilitates the propagation of the vibration of the piezoelectric element to the panel. The use of an elastic polymer lessens, when an external force is applied to the electronic device 1, the propagation of the external force to the piezoelectric element.

Although the foregoing embodiments and modifications describe the case where the structure in which the virtual plane including the main surface of the piezoelectric element 30 is not orthogonal to the perpendicular line to the main surface portion 101 of the panel 10, i.e. the main surface of the electronic device 1, in a section in the longer-side direction (line b-b) of the electronic device 1 has the advantageous effect of reducing the area occupied by the piezoelectric element 30 in the dimension along the longer side of the main surface of the electronic device 1, this is not a limitation. For example, a structure in which the virtual plane including the main surface of the piezoelectric element 30 is not orthogonal to the main surface portion 101 of the panel 10 in a section in the shorter-side direction of the electronic device 1 can also reduce the area occupied by the piezoelectric element 30 in the dimension along the shorter side of the main surface of the electronic device 1.

Although the foregoing embodiments describe the combinations of the panel 10 having a convex curved shape and the housing 60 having a concave curved shape or the combinations of the panel 10 having a concave curved shape and the housing 60 having a convex curved shape, this is not a limitation. Any combinations of the panel 10 having a convex curved shape and the housing 60 having a convex curved shape or any combinations of the panel 10 having a concave curved shape and the housing 60 having a concave curved shape are also available.

Although the foregoing embodiments describe the case where the thickness of the panel 10 is uniform in any area of the panel 10, this is not a limitation. The thickness of the panel 10 may be different depending on the area of the panel 10.

Although the foregoing embodiments describe a smartphone as an example, the disclosed technique may be applied to a flip mobile phone.

REFERENCE SIGNS LIST

1 electronic device
10 panel
20 display unit
30 piezoelectric element
40 input unit
50 controller
60 housing
70 joining member
80 support unit
101 main surface portion
102 curved portion
103 bent portion
104 second surface

The invention claimed is:

1. An electronic device comprising:
a housing;
a panel attached to the housing; and
a piezoelectric element attached to the panel,
wherein deformation of the piezoelectric element causes the panel to vibrate, to transmit human body vibration sound to an object in contact with the panel,
when the panel is removed from the housing and placed on a horizontal plane, the horizontal plane and a virtual plane including a main surface of the piezoelectric element intersect at a predetermined angle,
the panel has a convex curved surface with an intermediate area protruding more than both ends, in a predetermined section of the panel, and
when the panel is placed on the horizontal plane with the intermediate area being higher than the ends, the horizontal plane and the virtual plane including the main surface of the piezoelectric element intersect at the predetermined angle.

2. The electronic device according to claim 1,
wherein the panel has a convex curved shape.

3. The electronic device according to claim 1,
wherein the panel has a concave curved shape.

4. The electronic device according to claim 2,
wherein at least a part of the housing has a convex curved shape.

5. The electronic device according to claim 3,
wherein at least a part of the housing has a concave curved shape.

* * * * *